(12) United States Patent
Kim

(10) Patent No.: US 9,470,745 B2
(45) Date of Patent: Oct. 18, 2016

(54) SEMICONDUCTOR DEVICE CAPABLE OF PROBE TEST

(71) Applicant: SK hynix Inc., Gyeonggi-do (KR)

(72) Inventor: Jong-Su Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 183 days.

(21) Appl. No.: 14/326,182

(22) Filed: Jul. 8, 2014

(65) Prior Publication Data
US 2015/0234002 A1 Aug. 20, 2015

(30) Foreign Application Priority Data

Feb. 20, 2014 (KR) ........................ 10-2014-0019630

(51) Int. Cl.
*G01R 31/26* (2014.01)
*G01R 31/28* (2006.01)

(52) U.S. Cl.
CPC ....... *G01R 31/2644* (2013.01); *G01R 31/2884* (2013.01); *G01R 31/2886* (2013.01)

(58) Field of Classification Search
CPC ........... H01L 27/0255; H01L 27/0733; H01L 27/092; H01L 21/31144; H01L 21/76877; H01L 21/82; H01L 21/823431; H01L 21/823456; H01L 21/823468; H01L 21/823475; H01L 21/823481; H01L 2223/54426; H01L 2223/5446; H03K 17/08124; H03K 3/013; G01R 31/3606; G01R 31/3682; G01R 1/06794; G01R 31/2891; G01R 31/2644; G01R 31/2884; G01R 31/2886; H02H 9/046; H03F 3/16; G06F 2217/78
See application file for complete search history.

(56) References Cited

U.S. PATENT DOCUMENTS

| | | | | |
|---|---|---|---|---|
| 6,066,561 A * | 5/2000 | Kumar | .................... | H01L 22/12 257/E21.53 |
| 7,612,573 B2 * | 11/2009 | Kim | .................. | G01R 1/06794 324/750.3 |
| 7,759,955 B2 * | 7/2010 | Reinwald | .......... | G01R 31/2884 324/756.01 |
| 2012/0068725 A1 * | 3/2012 | Pagani | ............... | G01R 1/06794 324/750.16 |

FOREIGN PATENT DOCUMENTS

| KR | 100666176 | 1/2007 |
|---|---|---|
| KR | 100843227 | 7/2008 |

* cited by examiner

*Primary Examiner* — Vinh Nguyen
(74) *Attorney, Agent, or Firm* — IP & T Group LLP

(57) ABSTRACT

A semiconductor device includes a normal pad and a first monitoring unit suitable for monitoring whether a bunker is formed in the normal pad based on an inherent resistance component of the normal pad during a probe test.

14 Claims, 6 Drawing Sheets

SEMICONDUCTOR DEVICE CAPABLE OF PROBE TEST

CROSS-REFERENCE TO RELATED APPLICATIONS

The present application claims priority of Korean Patent Application No. 10-2014-0019630, filed on Feb. 20, 2014, which is incorporated herein by reference in its entirety.

BACKGROUND

1. Field

Exemplary embodiments of the present invention relate to a semiconductor design technology, and more particularly, to a semiconductor device capable of a probe test.

2. Description of the Related Art

The semiconductor fabrication process is generally divided into a fabrication process and an assembly process. The fabrication process forms a pattern of an integrated circuit on a wafer, and the assembly process packages semiconductor chips of a wafer state. Hereinafter, the semiconductor chips of the wafer state are referred to as 'semiconductor devices'.

A probe test for inspecting the electrical characteristics of semiconductor devices is performed between the fabrication process and the assembly process. The probe test saves time and reduces costs in subsequent processes, e.g., the assembly process, by sorting out bad chips among the semiconductor devices.

Currently, an additional test device is required to perform a probe test on semiconductor devices. The test device generally uses a probe needle. By electrically connecting the probe needle with a pad of the semiconductor device, the test device may exchange signals with the semiconductor device.

However, semiconductor devices have some concerns when undergoing a probe test, which will be further discussed in this application.

The pad on the semiconductor device has to be connected to the probe needle of the test device during the probe test. Currently, the pad may be left with an impression by the probe needle. As shown in FIG. 1, a part BK in a pad PD is left with an impression by a probe needle (not shown). Such an impression BK is called a bunker. When the bunker BK is formed in the pad PD, signaling capability becomes degraded since the resistance of the pad increases (the imperfection in the pad increases electrical resistance). Moreover, where a bonding wire is connected to the pad during the assembly process, a bonding failure may occur due to the bunker BK.

When the probe needle is connected to the pad, the pad gets stressed due to connection shock. As shown in FIGS. 2A and 2B, the pad PD gets stressed more on the edge region E than in the center region C. In severe cases, a crack may occur in the pad PD, which may result in leakage current going through the pad PD.

SUMMARY

Various exemplary embodiments of the present invention are directed to a semiconductor device capable of detecting a bunker formed in a normal pad.

Various exemplary embodiments of the present invention are directed to a semiconductor device capable of detecting whether a probe needle is coupled to an edge region of a pad.

In accordance with an exemplary embodiment of the present invention, a semiconductor device may include: a normal pad and a first monitoring unit suitable for monitoring whether a bunker is formed in the normal pad based on an inherent resistance component of the normal pad during a probe test.

The semiconductor device may further include a comparative pad on which a reference resistance component is reflected, wherein the first monitoring unit monitors whether the bunker is formed in the normal pad in response to a first voltage applied through the comparative pad and a second voltage applied through the normal pad.

In accordance with another exemplary embodiment of the present invention, a semiconductor device may include: a normal pad from which a center region and an edge region are electrically isolated and a monitoring unit suitable for monitoring whether a probe needle is coupled to the edge region of the normal pad during a probe test.

According to the embodiments of the present invention, it is possible to determine the progression of subsequent processes by detecting bunkers formed in the normal pads. Furthermore, according to the semiconductor device of the embodiments, it is possible to move the position of the probe needle into the center region of the normal pad by detecting whether the probe needle is coupled to an edge region of the normal pad. Accordingly, more stable test operations may be performed during a probe test.

DETAILED DESCRIPTION

Figure 1:
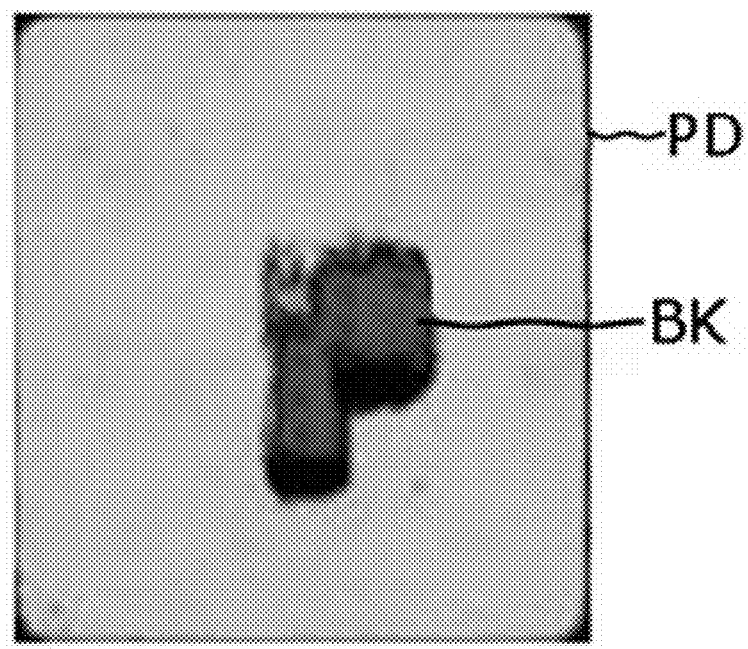
FIGS. 1 to 2B are diagrams illustrating a conventional semiconductor device.
Figure 2A:
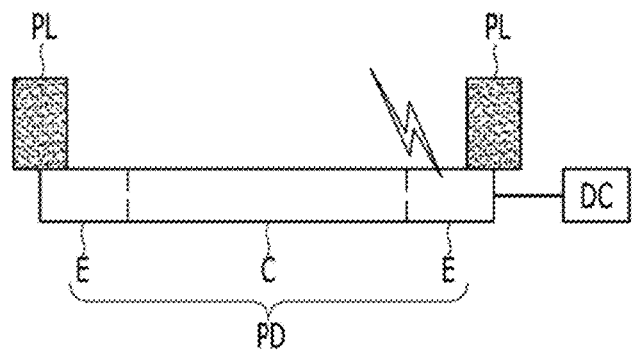
Figure 2B:
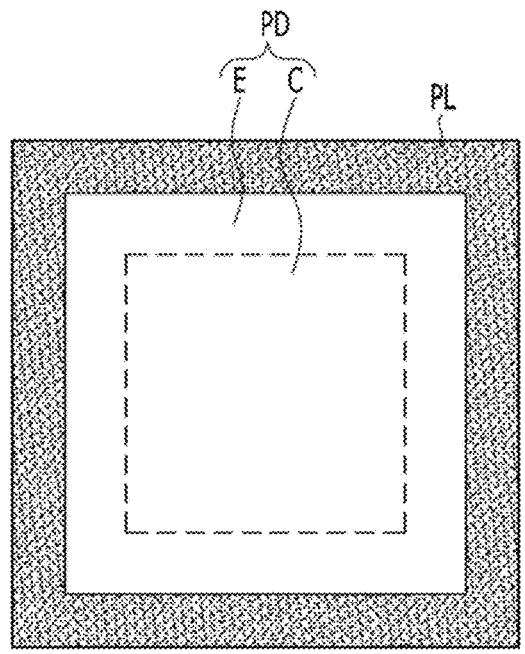

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and, in some instances, proportions may have been exaggerated in order to clearly illustrate features of the embodiments. Throughout the disclosure, reference numerals correspond directly to like numbered parts in the various figures and embodiments of the present invention. It is also noted that in this specification, "connected/coupled" refers to one component not only directly coupling another component but also indirectly coupling another component through an intermediate component. In addition, the singular form may include a plural form, and vice versa, as long as it is not specifically mentioned.

Figure 3:
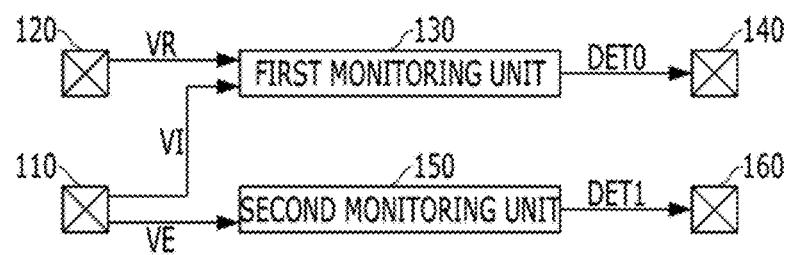
FIG. 3 is a block diagram illustrating a semiconductor device in accordance with an exemplary embodiment of the present invention.

FIG. 3 is a block diagram illustrating a semiconductor device in accordance with an exemplary embodiment of the present invention.

Referring to FIG. 3, the semiconductor device 100 may include a normal pad 110, a first monitoring path 120, 130 and 140, and a second monitoring path 150 and 160 for monitoring the normal pad 110.

The normal pad 110 may include an arbitrary pad which is used to electrically couple external components to the semiconductor device 100. For example, the normal pad 110 may include a data pad for interfacing data between the semiconductor device and external equipment.

The first monitoring path 120, 130 and 140 may include a comparative pad 120, a first monitoring unit 130, and a first monitoring pad 140. The first monitoring unit 130 monitors whether a bunker is formed in the normal pad 110 based on an inherent resistance component of the normal pad 110 and a reference resistance component of the comparative pad 120. The first monitoring pad 140 provides a first detection signal DET0 outputted from the first monitoring unit 130 to an external device.

The second monitoring path 150 and 160 may include a second monitoring unit 150 and a second monitoring pad 160. The second monitoring unit 150 monitors whether a probe needle is coupled to an edge region of the normal pad 110. The second monitoring pad 160 provides a second detection signal DET1 outputted from the second monitoring unit 150 to an external device.

Figure 4A:
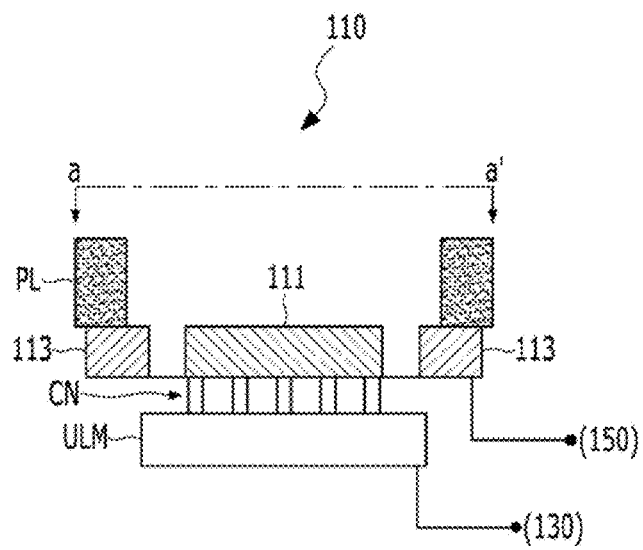
FIGS. 4A to 4C are diagrams illustrating a normal pad shown in FIG. 3.
Figure 4B:
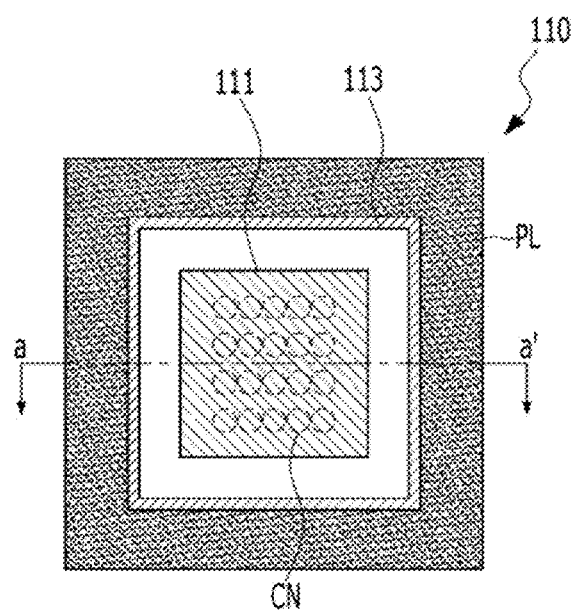
Figure 4C:
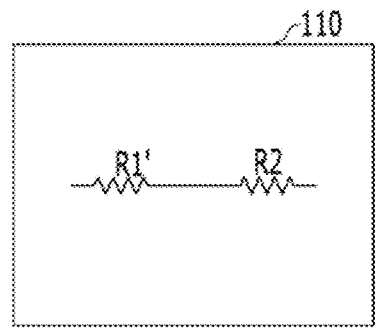

FIGS. 4A to 4C are diagrams illustrating the normal pad 110 shown in FIG. 3. In detail, FIGS. 4A and 4B show a side view and a top view of the normal pad 110, respectively, and FIG. 4C shows a circuit diagram modeling the resistance component reflected on the normal pad 110.

Referring to FIGS. 4A and 4B, the normal pad 110 may include a center region 111 and an edge region 113. The center region 111 may be coupled to an under metal layer UML through N contacts CN, N being a positive integer, and coupled to the first monitoring unit 130 through the N contacts CN and the under metal layer UML. The edge region 113 may be electrically isolated from the center region 111, and coupled to the second monitoring unit 150. A passivation layer PL may be disposed over the edge region 113. The edge region 113 may be designed to come in contact with the passivation layer PL such that a minimum area required for detecting contact with a probe needle is left exposed. This is intended to mitigate external stresses. External stresses may include pressure that occurs when the probe needle is coupled to the edge region 113 of the normal pad 110.

Referring to FIG. 4C, the normal pad 110 may include a first inherent resistance component R2 of the center region 111 and a second inherent resistance component R1' of the N contacts CN. The second inherent resistance component R1' may be determined based on the number of contacts which are electrically open among the N contacts CN. Where a bunker is formed in the center region 111 due to a shock occurring when the probe needle comes in contact with the center region 111, some electrically shorted contacts among the N contacts CN may become electrically open. Accordingly, the second inherent resistance component R1' may increase as the number of the open contacts among the N contacts CN increases. In contrast, the second inherent resistance component R1' may decrease as the number of the open contacts among the N contacts CN decreases.

Figure 5A:
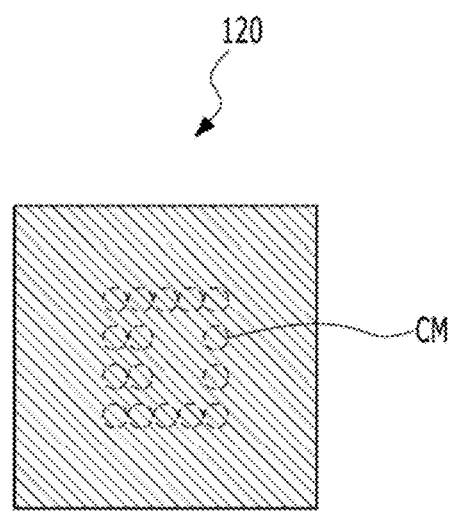
FIGS. 5A and 5B are diagrams illustrating a comparative pad shown in FIG. 3.
Figure 5B:
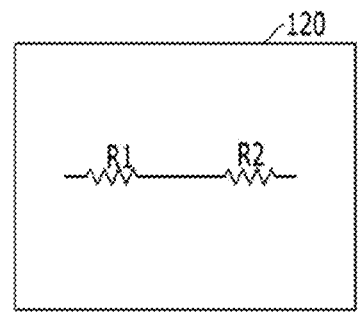

FIGS. 5A and 5B are diagrams illustrating the comparative pad 120 shown in FIG. 3. In detail, FIG. 5A shows a top view of the comparative pad 120, and FIG. 5B shows a circuit diagram modeling the resistance component reflected on the comparative pad 120.

Referring to FIG. 5A, the comparative pad 120 may be coupled to a under metal layer (not shown) through M contacts CM, M being a positive integer, and coupled to the first monitoring unit 130 through the M contacts CM and an under metal layer. Here, the number of the M contacts CM may be smaller than that of the N contacts CN coupled to the normal pad 110 shown in FIG. 4A, i.e., M<N, and the difference between the number of N contacts CN shown in FIG. 4A and the number of the M contacts CM shown in FIG. 5A may determine the sensitivity of detecting whether a bunker is formed in the normal pad 110. For example, the bunker formed in the normal pad 110 may be detected with more sensitivity as the difference decreases; in contrast, the bunker formed in the normal pad 110 may be detected with less sensitivity as the difference increases.

Referring to FIG. 5B, the comparative pad 120 may include a first reference resistance component R2 occurring in the comparative pad 120 itself, and a second reference resistance component R1 of the M contacts CM. The first reference resistance component R2 includes a resistance corresponding to the first inherent resistance component R2 of the normal pad 110. Though the comparative pad 120 and the normal pad 110 may have different shapes, the first reference resistance component R2 of the comparative pad 120 is regarded as the first inherent resistance component R2 of the normal pad 110 since the difference in resistance is negligible. The comparative pad 120 may also have the same shape as the normal pad 110. The second reference resistance component R1 may be determined based on the M contacts CM. As described above, the second reference resistance component R1 may increase as the number of open contacts among the M contacts CM coupled to the comparative pad 120 increases. In contrast, the second reference resistance component R1 may decrease as the number of open contacts among the M contacts CM coupled to the comparative pad 120 decreases.

Figure 6:
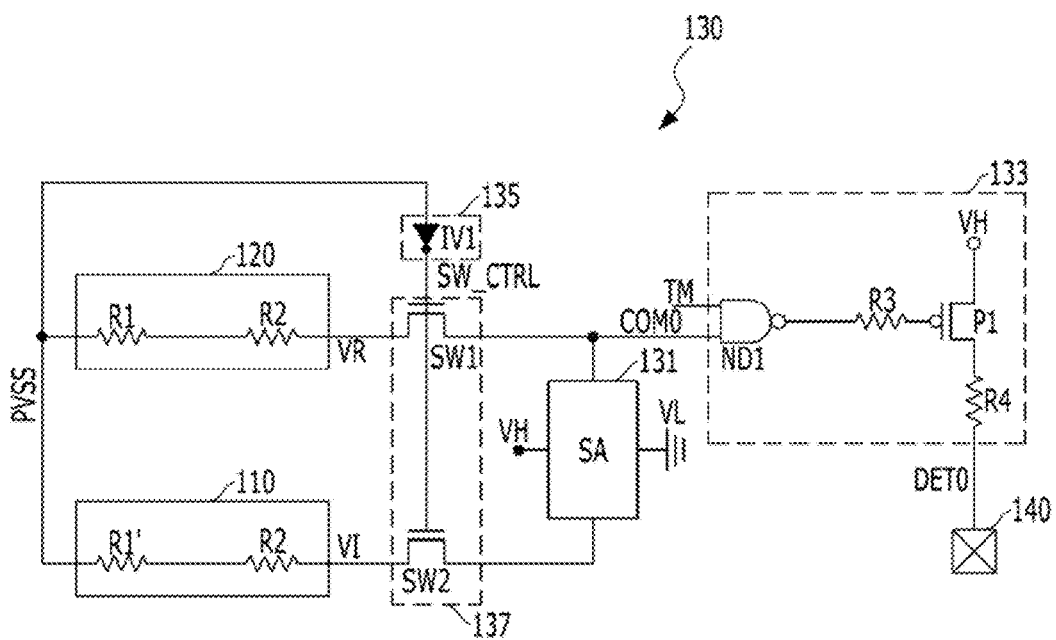
FIG. 6 is a detailed circuit diagram illustrating a first monitoring path shown in FIG. 3.

FIG. 6 is a detailed circuit diagram illustrating the first monitoring path 120, 130 and 140 shown in FIG. 3. In FIG. 6, the normal pad 110 corresponding to the constitution of FIG. 4C is shown, and the comparative pad 120 corresponding to the constitution of FIG. 5B is shown.

Referring to FIG. 6, the first monitoring unit 130 may include a first comparison unit 131, a first detection unit 133, a switching control unit 135, and a switching unit 137. The first comparison unit 131 compares a target voltage VI applied through the center region 111 of the normal pad 110 with a reference voltage VR applied through the comparative pad 120, and outputs a first comparing signal COM0. The first detection unit 133 generates the first detection signal DET0, which denotes whether a bunker is formed in the normal pad 110, in response to the first comparing signal COM0 and a test signal TM. The switching control unit 135 generates a switching control signal SW_CTRL in response to an external voltage PVSS applied during the probe test. The switching unit 137 transfers the target voltage VI and the reference voltage VR to the first comparison unit 131 in response to the switching control signal SW_CTRL.

The target voltage VI may include a voltage dropped by the first and second inherent resistance components R2 and R1' from the external voltage PVSS, and the reference voltage VR may include a voltage dropped by the first and second reference resistance components R2 and R1 from the external voltage PVSS. The external voltage PVSS may be applied through a probe needle during the probe test.

The first comparison unit 131 may include a sense amplifier SA for sensing and amplifying a voltage difference between the target voltage VI and the reference voltage VR. For example, the first comparison unit 131 generates the first comparing signal COM0 having a logic low level when the target voltage VI is greater than the reference voltage VR, and the first comparison unit 131 may generate the first comparing signal COM0 having a logic high level when the target voltage VI is lower than the reference voltage VR.

The first detection unit 133 may include a first logic operation unit ND1 and a first driving unit P1. The first logic operation unit ND1 performs a NAND operation on the test signal TM and the first comparing signal COM0. The first driving unit P1 drives an output terminal of the first detection signal DET0 to a predetermined voltage VH in response to a first logic signal outputted from the first logic operation unit ND1. For example, the first logic operation unit ND1 may include a NAND gate, and the first driving unit P1 may include a PMOS transistor. The first detection unit 133 may further include a first buffer resistor unit R3 coupled between the first logic operation unit ND1 and the first driving unit P1, and a second buffer resistor unit R4 coupled between the first driving unit P1 and the first monitoring pad 140.

Figure 7:
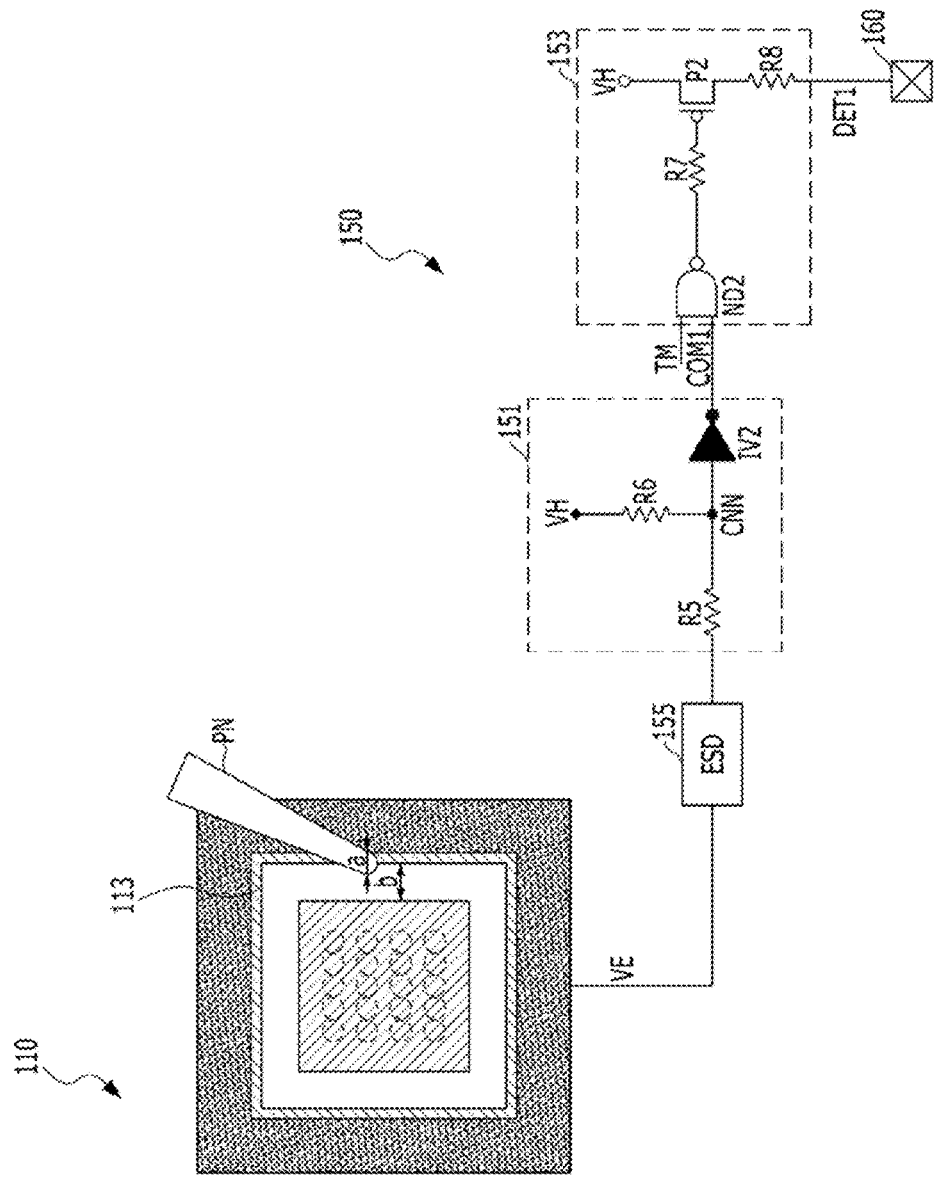
FIG. 7 is a detailed circuit diagram illustrating a second monitoring path shown in FIG. 3.

FIG. 7 is a detailed circuit diagram illustrating the second monitoring path 150 and 160 shown in FIG. 3. In FIG. 7, the normal pad 110 corresponding to FIG. 4B is shown.

Referring to FIG. 7, the second monitoring unit 150 may include a second comparison unit 151 and a second detection unit 153. The second comparison unit 151 compares a predetermined voltage VH with a connection voltage VE applied through the edge region 113 of the normal pad 110, and outputs a second comparing signal COM1. The second detection unit 153 generates the second detection signal DET1, which denotes whether the probe needle is coupled to the edge region 113, in response to the second comparing signal COM1 and the test signal TM.

The second comparison unit 151 may include a first voltage division resistor unit R6, a second voltage division resistor unit R5, and an inversion unit IV2. The first voltage division resistor unit R6 divides the predetermined voltage VH to provide the divided voltage to a comparison node CNN. The second voltage division resistor unit R5 divides the connection voltage VE to provide the divided voltage to the comparison node CNN. The inversion unit IV2 generates the second comparing signal COM1 based on a voltage of the comparison node CNN. The second comparison unit 151 makes the predetermined voltage VH fight against the connection voltage VE at the comparison node CNN, and outputs the second comparing signal COM1 through the inversion unit IV2 in response to the fighting result. Accordingly, the predetermined voltage VH may have an opposite polarity to the connection voltage VE. For example, the predetermined voltage VH may have a voltage corresponding to a logic high level while the connection voltage VE may have a voltage corresponding to a logic low level. Further, the first voltage division resistor unit R6 may be designed to have a resistance greater than the second voltage division resistor unit R5. This is, for easily switching over the voltage of the comparison node CNN to the connection voltage VE, from the predetermined voltage VH, when the predetermined voltage VH fights with the connection voltage VE.

The second detection unit 153 may include a second logic operation unit ND2 and a second driving unit P2. The second logic operation unit ND2 performs a NAND operation on the test signal TM and the second comparing signal COM1. The second driving unit P2 drives an output terminal of the second detection signal DET1 to the predetermined voltage VH in response to a second logic signal outputted from the second logic operation unit ND2. For example, the second logic operation unit ND2 may include a NAND gate, and the second driving unit P2 may include a PMOS transistor. Further, the second detection unit 153 may include a third buffer resistor unit R7 coupled between the second logic operation unit ND2 and the second driving unit P2, and a fourth buffer resistor unit R8 coupled between the second driving unit P2 and the second monitoring pad 160.

The second monitoring unit 150 may further include an electrostatic discharge (ESD) unit 155 coupled between the edge region 113 of the normal pad 110 and the second comparison unit 151.

Hereinafter, an operation of the semiconductor device shown in FIGS. 3 to 7 will be described in detail.

First, a first test operation according to the first monitoring path 120, 130 and 140 is explained.

During a probe test, the external voltage PVSS is supplied to the normal pad 110 and the comparative pad 120 through a probe needle, and the test signal TM is activated. For example, the test signal TM is activated to a logic high level.

The switching control unit 135 activates the switching control signal SW_CTRL in response to the external voltage PVSS, and the switching unit 137 transfers the target voltage VI applied through the normal pad 110 and the reference voltage VR applied through the comparative pad 120 to the first comparison unit 131 in response to the switching control signal SW_CTRL.

The first comparison unit 131 compares the target voltage VI with the reference voltage VR, and outputs the first comparing signal COM0, and the first detection unit 133 outputs the first detection signal DET0 to the first monitoring pad 140 based on the first comparing signal COM0 and the test signal TM. For example, the first comparison unit 131 outputs the first comparing signal COM0 having a logic low level when the target voltage VI is greater than the reference voltage VR, and the first detection unit 133 outputs the first detection signal DET0 of a floating state to the first monitoring pad 140 in response to the first comparing signal COM0 having a logic low level and the test signal TM having a logic high level. In another example, the first comparison unit 131 outputs the first comparing signal COM0 having a logic high level when the target voltage VI is lower than the reference voltage VR, and the first detection unit 133 outputs the first detection signal DET0 having a logic high level to the first monitoring pad 140 in response to the first comparing signal COM0 having a logic high level and the test signal TM having a logic high level.

A test device (not shown) determines whether a bunker is formed in the normal pad 110 in response to the first detection signal DET0. For example, where the first detection signal DET0 is a logic high level, the test device determines that the bunker is formed in the normal pad 110.

For reference, the normal pad 110 includes the first inherent resistance component R2 of the center region 111 and the second inherent resistance component R1' of the N contacts CN coupled to the center region 111. The second inherent resistance component R1' is determined based on the number of contacts which are electrically open among the N contacts CN. For example, where a bunker is formed in the center region 111 due to a shock occurring when the probe needle comes in contact with the center region 111, some contacts among electrically shorted N contacts CN may become electrically open. The second inherent resistance component R1' increases as the number of open contacts among the N contacts CN increases; in reverse, the second inherent resistance component R1' decreases when the number of open contacts among the N contacts CN is low. Accordingly, when the second inherent resistance component R1' decreases, the target voltage VI is greater than the reference voltage VR and it can be seen that a bunker is not formed in the normal pad 110. On the other hand, when the second inherent resistance component R1' increases, the target voltage VI is lower than the reference voltage VR and it can be seen that a bunker is formed in the normal pad 110.

Next, a second test operation according to the second monitoring path 150 and 160 is explained.

During a probe test, the second monitoring unit 150 monitors whether a probe needle PN is coupled to the edge region 113 of the normal pad 110 when the test signal TM is activated. In detail, the second comparison unit 151 compares the predetermined voltage VH with the connection voltage VE applied through the edge region 113 of the normal pad 110, and outputs the second comparing signal COM1. The second detection unit 153 generates the second detection signal DET1 to the second monitoring pad 160 in response to the second comparing signal COM1 and the test signal TM. For example, when the test signal TM is activated to a logic high level, the second comparison unit 151 outputs the second comparing signal COM1 having a logic low level in response to the predetermined voltage VH, and the second detection unit 153 generates the second detection signal DET1 of a floating state to the second monitoring pad 160 in response to the second comparing signal COM having the logic low level and the test signal TM having the logic high level. When the probe needle PN is coupled to the edge region 113 of the normal pad 110, the second comparison unit 151 outputs the second comparing signal COM1 having a logic high level in response to the connection voltage VE, and the second detection unit 153 generates the second detection signal DET1 having a logic high level to the second monitoring pad 160 in response to the second comparing signal COM1 having a logic high level and the test signal TM having a logic high level.

A test device (not shown) determines whether the probe needle PN is coupled to the edge region 113 of the normal pad 110 in response to the second detection signal DET1. For example, where the second detection signal DET1 is a logic high level, the test device determines that the probe needle PN is coupled to the edge region 113 of the normal pad 110, and moves the position of the probe needle PN toward the center region 111 of the normal pad 110.

As described above, the semiconductor device in accordance with the exemplary embodiments of the present invention may detect both whether a bunker is formed in a normal pad and whether a probe needle is coupled to an edge region of the normal pad.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a normal pad; and
   a first monitoring unit suitable for monitoring whether a bunker is formed in the normal pad based on an inherent resistance component of the normal pad during a probe test,
   wherein the first monitoring unit compares a first voltage applied through a comparative pad including a reference resistance component with a second voltage applied through a center region of the normal pad and generates a detection signal that denotes whether the bunker is formed in the normal pad,
   wherein the first monitoring unit comprises:
      a first comparison unit suitable for comparing the first voltage with the second voltage and outputting a first comparing signal; and
      a first detection unit suitable for generating the detection signal that denotes whether the bunker is formed in the normal pad, in response to the first comparing signal and a test signal inputted from a test device during the probe test,
   wherein the first comparison unit comprises:
      a sense amplifier suitable for sensing and amplifying a voltage difference between the first voltage and the second voltage.

2. The semiconductor device of claim 1, wherein the inherent resistance component of the normal pad is determined based on the number of contacts which are electrically opened among a plurality of contacts coupled to the first monitoring unit, and the reference resistance component is determined based on the number of contacts coupled to the comparative pad.

3. The semiconductor device of claim 1, wherein the first detection unit comprises:
   a first logic operation unit suitable for performing a NAND operation on the test signal and the first comparing signal; and
   a first driving unit suitable for driving an output terminal of the first detection signal to a predetermined voltage in response to a first logic signal outputted from the first logic operation unit.

4. The semiconductor device of claim 1, wherein the first monitoring unit further comprises:
   a switching control unit suitable for generating a switching control signal in response to an external voltage applied during the probe test; and
   a switching unit suitable for transferring the first voltage and the second voltage to the first comparison unit in response to the switching control signal.

5. The semiconductor device of claim 4, wherein the external voltage is applied to the normal pad and the comparative pad, and applied through a probe needle during the probe test.

6. The semiconductor device of claim 1, further comprising:
   a first monitoring pad suitable for providing the detection signal outputted from the first monitoring unit to an external device.

7. A semiconductor device comprising:
   a normal pad comprises an edge region that is electrically isolated from a center region; and
   a second monitoring unit coupled to an edge region of the normal pad suitable for monitoring whether a probe needle is coupled to the edge region of the normal pad during a probe test,
   wherein the second monitoring unit comprises:
      a second comparison unit suitable for comparing a third voltage having a predetermined voltage level with a fourth voltage, the fourth voltage being received through the edge region of the normal pad, and outputting a second comparing signal; and
      a second detection unit suitable for generating a second detection signal, which denotes whether the probe needle is coupled to the edge region, in response to the second comparing signal and a test signal inputted from a test device during the probe test.

8. The semiconductor device of claim 7, wherein the second comparison unit comprises:
   a first voltage division resistor unit suitable for dividing the third voltage and providing a fifth voltage to a comparison node;
   a second voltage division resistor unit suitable for dividing the fourth voltage and for providing a sixth voltage to the comparison node; and
   an inversion unit suitable for generating the second comparing signal based on a seventh voltage of the comparison node.

9. The semiconductor device of claim 8, wherein the third voltage has an opposite polarity to the fourth voltage, and the first voltage division resistor unit has a resistance greater than the second voltage division resistor unit.

10. The semiconductor device of claim 7, wherein the second detection unit comprises:
    a second logic operation unit suitable for performing a NAND operation on the test signal and the second comparing signal; and
    a second driving unit suitable for driving an output terminal of the second detection signal to the third voltage in response to a second logic signal outputted from the second logic operation unit.

11. The semiconductor device of claim 7, wherein the second monitoring unit further comprises:
    an electrostatic discharge (ESD) unit coupled between the edge region of the normal pad and the second comparison unit.

12. The semiconductor device of claim 7, further comprising:
    a second monitoring pad suitable for providing a second detection signal outputted from the second monitoring unit to an external device.

13. A semiconductor device comprising:
    a normal pad where a center region and an edge region are electrically isolated; and
    a monitoring unit suitable for monitoring whether a probe needle is coupled to the edge region of the normal pad during a probe test,
    wherein the monitoring unit comprises:
       a comparison unit suitable for comparing a first voltage applied through a comparative pad with a second voltage applied through the edge region of the normal pad, and outputting a comparing signal; and
       a second detection unit suitable for generating a detection signal, which denotes whether the probe needle is coupled to the edge region, in response to the comparing signal and a test signal inputted from a test device during the probe test.

14. The semiconductor device of claim 13, further comprising:
    a monitoring pad coupled to the second detection unit and suitable for providing a detection signal outputted from the monitoring unit to an external device.

* * * * *